(12) United States Patent
Nondhasitthichai et al.

(10) Patent No.: US 9,082,607 B1
(45) Date of Patent: Jul. 14, 2015

(54) MOLDED LEADFRAME SUBSTRATE SEMICONDUCTOR PACKAGE

(75) Inventors: Somchai Nondhasitthichai, Bangkok (TH); Saravuth Sirinorakul, Bangkok (TH)

(73) Assignee: UTAC THAI LIMITED, Bangkok (TH)

( * ) Notice: Subject to any disclaimer, the term of this patent is extended or adjusted under 35 U.S.C. 154(b) by 13 days.

(21) Appl. No.: 12/002,186

(22) Filed: Dec. 14, 2007

Related U.S. Application Data (60) Provisional application No. 60/875,162, filed on Dec. 14, 2006, provisional application No. 60/877,274, filed on Dec. 26, 2006.

(51) Int. Cl.
*H01L 21/00* (2006.01)
*H01L 23/00* (2006.01)

(52) U.S. Cl.
CPC ......... *H01L 24/00* (2013.01); *H01L 2924/1511* (2013.01); *H01L 2924/1711* (2013.01)

(58) Field of Classification Search
USPC .......................................... 257/666; 438/123
See application file for complete search history.

(56) References Cited

U.S. PATENT DOCUMENTS

| | | | |
|---|---|---|---|
| 3,611,061 A | 10/1971 | Segerson | 317/234 R |
| 4,411,719 A | 10/1983 | Lindberg | 156/64 |
| 4,501,960 A | 2/1985 | Jouvet et al. | |
| 4,801,561 A | 1/1989 | Sankhagowit | 437/207 |
| 4,855,672 A | 8/1989 | Shreeve | 324/158 R |
| 5,105,259 A | 4/1992 | McShane et al. | |
| 5,195,023 A | 3/1993 | Manzione et al. | |
| 5,247,248 A | 9/1993 | Fukunaga | 324/158 |
| 5,248,075 A | 9/1993 | Young et al. | 228/5.1 |
| 5,281,851 A | 1/1994 | Mills et al. | |
| 5,285,194 A | 2/1994 | Kondo et al. | |
| 5,343,076 A | 8/1994 | Katayama et al. | |
| 5,396,185 A | 3/1995 | Honma et al. | 324/754 |
| 5,397,921 A | 3/1995 | Karnezos | |
| 5,479,105 A | 12/1995 | Kim et al. | 324/755 |
| 5,535,101 A | 7/1996 | Miles et al. | |
| 5,596,231 A | 1/1997 | Combs | |
| 5,708,295 A | 1/1998 | Oga et al. | |
| 5,767,527 A | 6/1998 | Yoneda et al. | |
| 5,843,808 A | 12/1998 | Karnezos | |

(Continued)

OTHER PUBLICATIONS

U.S. Appl. No. 11/788,496, filed May 19, 2007, Smochai Nondhasitthichai et al.

(Continued)

*Primary Examiner* — Mark Tornow
(74) *Attorney, Agent, or Firm* — Haverstock & Owens LLP (57) ABSTRACT

A process for forming an optical package comprises at least partially encasing a first leadframe strip in a first mold compound thereby forming a molded leadframe strip, mounting at least one optical semiconductor device on the molded leadframe strip, at least partially encasing the molded leadframe strip, and singulating the molded leadframe strip to form discrete packages for optical applications. An apparatus for forming an optical package comprises means for at least partially encasing a first leadframe strip in a first mold compound thereby forming a molded leadframe strip, means for mounting at least one optical semiconductor device on the at least one molded leadframe strip, means for at least partially encasing the molded leadframe strip, and means for singulating the molded leadframe strip to form discrete and grid array packages.

16 Claims, 12 Drawing Sheets

(56) References Cited

U.S. PATENT DOCUMENTS

| | | | | |
|---|---|---|---|---|
| 5,872,394 | A | 2/1999 | Shinohara et al. | |
| 5,990,692 | A | 11/1999 | Jeong et al. | 324/755 |
| 6,033,933 | A | 3/2000 | Hur | |
| 6,072,239 | A | 6/2000 | Yoneda et al. | 257/730 |
| 6,111,324 | A | 8/2000 | Sheppard et al. | |
| 6,159,770 | A | 12/2000 | Tetaka et al. | 438/112 |
| 6,177,729 | B1 | 1/2001 | Benenati et al. | |
| 6,197,615 | B1 | 3/2001 | Song et al. | |
| 6,208,020 | B1 | 3/2001 | Minamio et al. | |
| 6,229,200 | B1 | 5/2001 | Mclellan et al. | |
| 6,242,281 | B1 | 6/2001 | Mclellan et al. | |
| 6,250,841 | B1 | 6/2001 | Ledingham | |
| 6,258,629 | B1 | 7/2001 | Niones et al. | |
| 6,284,569 | B1 | 9/2001 | Sheppard et al. | |
| 6,285,075 | B1 | 9/2001 | Combs et al. | |
| 6,294,100 | B1 | 9/2001 | Fan et al. | |
| 6,304,000 | B1 | 10/2001 | Isshiki et al. | 257/782 |
| 6,326,678 | B1 | 12/2001 | Karnezos et al. | |
| 6,329,711 | B1 | 12/2001 | Kawahara et al. | 257/698 |
| 6,353,263 | B1 | 3/2002 | Dotta et al. | |
| 6,372,625 | B1 | 4/2002 | Shigeno et al. | |
| 6,376,921 | B1 | 4/2002 | Yoneda et al. | 257/787 |
| 6,384,472 | B1 | 5/2002 | Huang | |
| 6,392,427 | B1 | 5/2002 | Yang | 324/755 |
| 6,414,385 | B1 | 7/2002 | Huang et al. | 257/690 |
| 6,429,048 | B1 | 8/2002 | McLellan et al. | |
| 6,451,709 | B1 | 9/2002 | Hembree | 438/759 |
| 6,455,348 | B1 | 9/2002 | Yamaguchi | |
| 6,476,469 | B2 | 11/2002 | Hung et al. | |
| 6,489,218 | B1 | 12/2002 | Kim et al. | |
| 6,498,099 | B1 | 12/2002 | McLellan et al. | |
| 6,507,116 | B1 | 1/2003 | Caletka et al. | |
| 6,545,332 | B2 * | 4/2003 | Huang | 257/433 |
| 6,545,347 | B2 | 4/2003 | McClellan | |
| 6,552,417 | B2 | 4/2003 | Combs | |
| 6,552,423 | B2 | 4/2003 | Song et al. | |
| 6,566,740 | B2 | 5/2003 | Yasunaga et al. | |
| 6,573,121 | B2 | 6/2003 | Yoneda et al. | 438/106 |
| 6,585,905 | B1 | 7/2003 | Fan et al. | |
| 6,586,834 | B1 | 7/2003 | Sze et al. | |
| 6,635,957 | B2 | 10/2003 | Kwan et al. | |
| 6,667,191 | B1 | 12/2003 | McLellan et al. | |
| 6,683,368 | B1 | 1/2004 | Mostafazadeh | |
| 6,686,667 | B2 * | 2/2004 | Chen et al. | 257/787 |
| 6,703,696 | B2 | 3/2004 | Ikenaga et al. | |
| 6,723,585 | B1 | 4/2004 | Tu et al. | |
| 6,724,071 | B2 | 4/2004 | Combs | |
| 6,734,044 | B1 | 5/2004 | Lin et al. | |
| 6,734,552 | B2 | 5/2004 | Combs et al. | |
| 6,737,755 | B1 | 5/2004 | McLellan et al. | |
| 6,764,880 | B2 | 7/2004 | Wu et al. | |
| 6,781,242 | B1 | 8/2004 | Fan et al. | |
| 6,798,046 | B1 | 9/2004 | Miks | |
| 6,800,948 | B1 | 10/2004 | Yeung et al. | |
| 6,812,552 | B2 | 11/2004 | Islam et al. | |
| 6,818,472 | B1 | 11/2004 | Fan et al. | |
| 6,818,978 | B1 | 11/2004 | Fan | |
| 6,818,980 | B1 | 11/2004 | Pedron, Jr. | |
| 6,841,859 | B1 | 1/2005 | Thamby et al. | |
| 6,876,066 | B2 | 4/2005 | Fee et al. | |
| 6,893,169 | B1 | 5/2005 | Exposito et al. | |
| 6,894,376 | B1 | 5/2005 | Mostafazadeh et al. | |
| 6,897,428 | B2 | 5/2005 | Minamio et al. | |
| 6,927,483 | B1 | 8/2005 | Lee et al. | |
| 6,933,176 | B1 | 8/2005 | Kirloskar et al. | |
| 6,933,594 | B2 | 8/2005 | McLellan et al. | |
| 6,940,154 | B2 | 9/2005 | Pedron et al. | |
| 6,946,324 | B1 | 9/2005 | McLellan et al. | |
| 6,964,918 | B1 | 11/2005 | Fan et al. | |
| 6,967,126 | B2 * | 11/2005 | Lee et al. | 438/122 |
| 6,979,594 | B1 | 12/2005 | Fan et al. | |
| 6,982,491 | B1 | 1/2006 | Fan et al. | |
| 6,984,785 | B1 | 1/2006 | Diao et al. | |
| 6,989,294 | B1 | 1/2006 | McLellan et al. | |
| 6,995,460 | B1 | 2/2006 | McLellan et al. | |
| 7,008,825 | B1 | 3/2006 | Bancod et al. | 438/123 |
| 7,009,286 | B1 | 3/2006 | Kirloskar et al. | |
| 7,045,883 | B1 | 5/2006 | McCann et al. | |
| 7,049,177 | B1 | 5/2006 | Fan et al. | |
| 7,052,935 | B2 | 5/2006 | Pai et al. | |
| 7,060,535 | B1 | 6/2006 | Sirinorakul | |
| 7,071,545 | B1 | 7/2006 | Patel et al. | |
| 7,091,581 | B1 | 8/2006 | McLellan et al. | |
| 7,101,210 | B2 | 9/2006 | Lin et al. | |
| 7,102,210 | B2 | 9/2006 | Ichikawa | |
| 7,125,747 | B2 | 10/2006 | Lee et al. | |
| 7,205,178 | B2 | 4/2007 | Shiu et al. | |
| 7,224,048 | B1 | 5/2007 | McLellan et al. | |
| 7,247,526 | B1 | 7/2007 | Fan et al. | 438/123 |
| 7,253,503 | B1 | 8/2007 | Fusaro et al. | |
| 7,259,678 | B2 | 8/2007 | Brown et al. | |
| 7,274,088 | B2 | 9/2007 | Wu et al. | |
| 7,314,820 | B2 | 1/2008 | Lin et al. | |
| 7,315,077 | B2 | 1/2008 | Choi et al. | |
| 7,315,080 | B1 | 1/2008 | Fan et al. | |
| 7,342,305 | B1 | 3/2008 | Diao et al. | |
| 7,344,920 | B1 | 3/2008 | Kirloskar et al. | |
| 7,348,663 | B1 * | 3/2008 | Kirloskar et al. | 257/704 |
| 7,358,119 | B2 | 4/2008 | McLellan et al. | |
| 7,371,610 | B1 | 5/2008 | Fan et al. | |
| 7,372,151 | B1 | 5/2008 | Fan et al. | |
| 7,381,588 | B1 | 6/2008 | Patel et al. | |
| 7,399,658 | B2 * | 7/2008 | Shim et al. | 438/106 |
| 7,408,251 | B2 | 8/2008 | Hata et al. | |
| 7,411,289 | B1 | 8/2008 | McLellan et al. | |
| 7,449,771 | B1 | 11/2008 | Fan et al. | |
| 7,459,345 | B2 | 12/2008 | Hwan | |
| 7,482,690 | B1 | 1/2009 | Fan et al. | |
| 7,495,319 | B2 | 2/2009 | Fukuda et al. | |
| 7,507,603 | B1 | 3/2009 | Berry et al. | |
| 7,595,225 | B1 | 9/2009 | Fan et al. | |
| 7,608,484 | B2 | 10/2009 | Lange et al. | |
| 7,709,857 | B2 | 5/2010 | Kim et al. | |
| 7,714,418 | B2 | 5/2010 | Lim et al. | |
| 8,035,207 | B2 | 10/2011 | Camacho et al. | |
| 2001/0007285 | A1 | 7/2001 | Yamada et al. | |
| 2002/0109214 | A1 | 8/2002 | Minamio et al. | |
| 2003/0006055 | A1 | 1/2003 | Chien-Hung et al. | |
| 2003/0045032 | A1 | 3/2003 | Abe | |
| 2003/0071333 | A1 | 4/2003 | Matsuzawa | |
| 2003/0071345 | A1 | 4/2003 | Corisis | |
| 2003/0143776 | A1 | 7/2003 | Pedron, Jr. et al. | |
| 2003/0178719 | A1 | 9/2003 | Combs et al. | |
| 2003/0201520 | A1 | 10/2003 | Knapp et al. | |
| 2003/0207498 | A1 | 11/2003 | Islam et al. | |
| 2003/0234454 | A1 | 12/2003 | Pedron et al. | |
| 2004/0014257 | A1 * | 1/2004 | Kim et al. | 438/111 |
| 2004/0026773 | A1 | 2/2004 | Koon et al. | |
| 2004/0046237 | A1 | 3/2004 | Abe et al. | |
| 2004/0046241 | A1 | 3/2004 | Combs et al. | |
| 2004/0070055 | A1 | 4/2004 | Punzalan et al. | |
| 2004/0080025 | A1 | 4/2004 | Kasahara et al. | |
| 2004/0110319 | A1 | 6/2004 | Fukutomi et al. | |
| 2005/0003586 | A1 | 1/2005 | Shimanuki et al. | |
| 2005/0077598 | A1 | 4/2005 | Goh et al. | |
| 2005/0077613 | A1 | 4/2005 | McLellan et al. | |
| 2005/0236701 | A1 | 10/2005 | Minamio et al. | |
| 2005/0263864 | A1 | 12/2005 | Islam et al. | |
| 2006/0022316 | A1 | 2/2006 | Huang et al. | |
| 2006/0035414 | A1 | 2/2006 | Park et al. | |
| 2006/0071351 | A1 | 4/2006 | Lange | |
| 2006/0170081 | A1 | 8/2006 | Gerber et al. | |
| 2006/0192295 | A1 | 8/2006 | Lee et al. | |
| 2006/0223229 | A1 | 10/2006 | Kirloskar et al. | |
| 2006/0223237 | A1 | 10/2006 | Combs et al. | |
| 2006/0273433 | A1 | 12/2006 | Itou et al. | |
| 2007/0001278 | A1 | 1/2007 | Jeon et al. | |
| 2007/0013038 | A1 | 1/2007 | Yang | |
| 2007/0029540 | A1 | 2/2007 | Kajiwara et al. | |
| 2007/0093000 | A1 | 4/2007 | Shim et al. | |
| 2007/0200210 | A1 | 8/2007 | Zhao et al. | |
| 2007/0235217 | A1 | 10/2007 | Workman | |
| 2008/0048308 | A1 | 2/2008 | Lam | |
| 2008/0150094 | A1 | 6/2008 | Anderson | |

(56) References Cited

U.S. PATENT DOCUMENTS

| | | |
|---|---|---|
| 2009/0014854 A1 | 1/2009 | Cho et al. |
| 2009/0152691 A1 | 6/2009 | Nguyen et al. |
| 2009/0152694 A1 | 6/2009 | Bemmerl et al. |
| 2009/0230525 A1 | 9/2009 | Chang Chien et al. |
| 2009/0236713 A1 | 9/2009 | Xu et al. |
| 2010/0133565 A1 | 6/2010 | Cho et al. |
| 2010/0149773 A1 | 6/2010 | Said |
| 2010/0178734 A1 | 7/2010 | Lin |
| 2010/0224971 A1 | 9/2010 | Li |
| 2011/0076805 A1 | 3/2011 | Nondhasitthichai et al. |
| 2011/0115061 A1 | 5/2011 | Krishnan et al. |
| 2011/0201159 A1 | 8/2011 | Mori et al. |

OTHER PUBLICATIONS

U.S. Appl. No. 11/731,522, filed Mar. 30, 2007, Saravuth Sirinorakul et al.

U.S. Appl. No. 12/002,054, filed Dec. 14, 2007, Smochai Nondhasitthichai et al.

U.S. Appl. No. 12/002,187, filed Dec. 14, 2007, Smochai Nondhasitthichai et al.

U.S. Appl. No. 12/154,483, filed May 22, 2008, Saravuth Sininorakul et al.

Office Action dated Jan. 28, 2010, U.S. Appl. No. 12/378,119, filed Feb. 10, 2009, Somchai Nondhasitthichai et al.

Office Action dated May 11, 2010, U.S. Appl. No. 13/002,054, filed Dec. 14, 2007, Somchai Nondhasitthichai et al.

Office Action dated Oct. 29, 2010, U.S. Appl. No. 12/378,119, filed Feb. 2, 2009, Somchai Nondhasitthichai et al.

Non-Final Office Action mailed Dec. 20, 2012, U.S. Appl. No. 13/045,253, filed Mar. 10, 2011, Saravuth Sirinorakul.

Office Action dated Dec. 5, 2011, U.S. Appl. No. 12/576,846, filed Oct. 9, 2009, Somchai Nondhasitthichai et al.

Office Action mailed Dec. 19, 2012, U.S. Appl. No. 12/834,688, filed Jul. 12, 2010, Saravuth Sirinorakul.

Office Action dated Feb. 10, 2011, U.S. Appl. No. 12/002,187, filed Dec. 14, 2007, Somchai Nondhasitthichai et al.

Michael Quirk and Julian Serda, Semiconductor Manufacturing Technology, Pearson Education International, Pearson Prentice Hall, 2001, p. 587-588.

Office Action dated May 9, 2011, U.S. Appl. No. 12/231,710, filed Sep. 4, 2008, Saravuth Sirinorakul et al.

Notice of Allowance, dated Nov. 28, 2012, U.S. Appl. No. 12/960,268, filed Dec. 3, 2012, Saravuth Sirinorakul et al.

Office Action dated Aug. 3, 2011, U.S. Appl. No. 12/002,187, filed Dec. 14, 2007, Somchai Nondhasitthichai et al.

Office Action dated Apr. 25, 2012, U.S. Appl. No. 12/960,268, filed Dec. 3, 2010, Somchai Nondhasitthichai et al.

Office Action dated May 7, 2012, U.S. Appl. No. 12/576,846, filed Oct. 9, 2009, Somchai Nondhasitthichai et al.

Office Action mailed on Jan. 28, 2014, U.S. Appl. No. 12/002,054, filed Dec. 14, 2007, Somchai Nondhasitthichai et al.

Office Action mailed on Jan. 15, 2014, U.S. Appl. No. 12/002,187, filed Dec. 14, 2007, Somchai Nondhasitthichai et al.

Office Action mailed on Dec. 31, 2013, U.S. Appl. No. 12/378,119, filed Feb. 10, 2009, Somchai Nondhasitthichai et al.

Office Action mailed on Dec. 27, 2013, U.S. Appl. No. 12/576,846, filed Oct. 9, 2009, Somchai Nondhasitthichai et al.

U.S. Appl. No. 11/899,189, Saravuth Sirinorakul et al.

U.S. Appl. No. 12/231,710, Saravuth Sirinorakul et al.

U.S. Appl. No. 12/287,174, Saravuth Sirinorakul et al.

U.S. Appl. No. 12/378,119, Somchai Nondhasitthichai et al.

U.S. Appl. No. 12/383,135, Somchai Nondhasitthichai et al.

Non-Final Office Action mailed Dec. 30, 2014, U.S. Appl. No. 13/886,888, filed May 3, 2013, Somchai Nondhasitthichai.

* cited by examiner

MOLDED LEADFRAME SUBSTRATE SEMICONDUCTOR PACKAGE

RELATED APPLICATIONS

This application claims benefit of priority under 35 U.S.C. section 119(e) of U.S. Provisional Patent Application 60/875,162 filed Dec. 14, 2006, entitled MOLDED-LEADFRAME SUBSTRATE SEMICONDUCTOR PACKAGE and U.S. Provisional Patent Application 60/877,274 filed Dec. 26, 2006, entitled MOLDED-LEADFRAME SUBSTRATE SEMICONDUCTOR PACKAGE, which are both incorporated herein by reference.

FIELD OF THE INVENTION

The present invention is in the field of semiconductor packaging and is more specifically directed to package with heat transfer.

BACKGROUND

Optical semiconductor devices are found in many common appliances, such as digital cameras, digital camcorders, laptop computers, cellular phones, and many other devices. Generally, optical devices comprise charge coupled devices along with an image or video processor to compress and transmit data.

Figure 1:
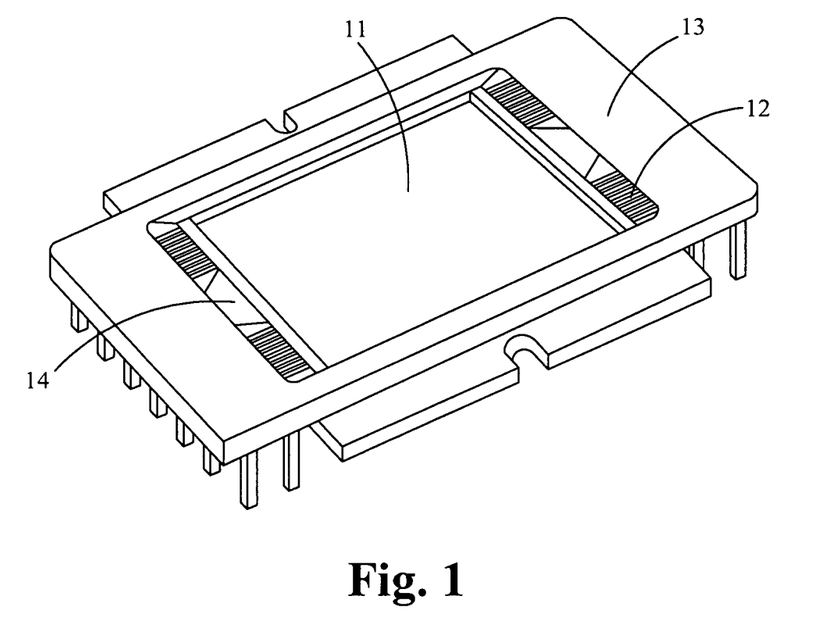
FIG. 1 is a prior art optical semiconductor package.

FIG. 1 shows optical semiconductor device 10 in current practice. The device 10 is a leadframe based device wherein an optical die 11 is mounted on a leadframe 12. The leadframe 12 is partially encased in a mold compound 13 leaving an opening 14 for the optical die 11. Optionally, a light permeable covering (not shown) is placed over the optical die 11 for protection. Although such devices 10 offer a high degree of reliability, they are generally limited to a low input output (I/O) count. As devices with optical die 11 increase in complexity and consumers demand items such as cameras having more image capturing capability, die sizes and I/O counts increase. In such applications with dozens or hundreds of I/O, such devices 10 are not an option. In one current example, every prominent manufacturer of high definition televisions offers a rear projection display option. This is commonly marketed by Sony as SXRD and Samsung as DLP, licensed from Texas Instruments. The complexity of such an optical application requires dozens to hundreds of I/O.

To overcome the issues mentioned above, the semiconductor industry has moved toward Ball Grid Array (BGA) packages. The BGA is descended from the pin grid array (PGA), which is a package with one face covered (or partly covered) with pins in a grid pattern. These pins are used to conduct electrical signals from the integrated circuit (IC) to the printed circuit board (PCB) it is placed on. In a BGA, the pins are replaced by balls of solder stuck to the bottom of the package. The device is placed on a PCB having copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies. The BGA is a solution to the problem of producing a miniature package for an IC with many hundreds of I/O. As pin grid arrays and dual-in-line (DIP) surface mount (SOIC) packages are produced with more and more pins, and with decreasing spacing between the pins, difficulties arose in the soldering process. As package pins got closer together, the danger of accidentally bridging adjacent pins with solder grew. BGAs do not have this problem, because the solder is factory-applied to the package in exactly the right amount. Alternatively, solder balls are able to be replaced by solder landing pads, forming a Land Grid Array (LGA) package.

Figure 2:
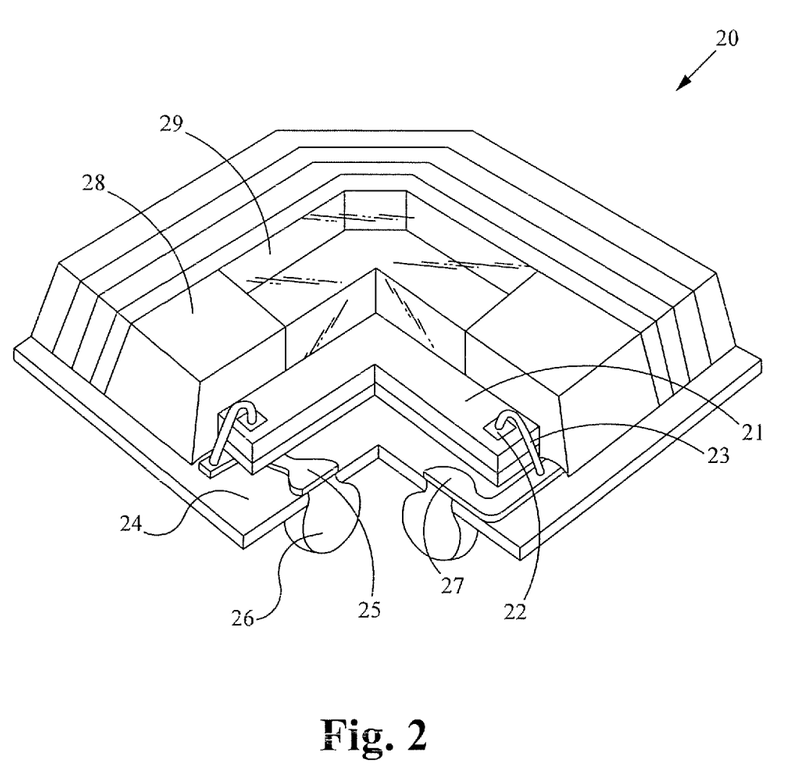
FIG. 2 is a prior art optical Ball Grid Array package in cross section.

FIG. 2 shows a cutaway image of a generic BGA package 20. Generally, an IC 21 has bondpads 22 to which bondwires 23 are affixed. The IC 21 is mounted on a substrate 24. In current practice, the substrate 24 is a laminate, such as polyimide. Generally, the substrate 24 is of a similar construction to a PCB. The substrate 24 has copper patterns 25 formed thereon. The bondwires 23 effectuate electrical contact between the IC 21 and the copper patterns 25. The copper patterns 25 are electrically connected to solder balls 26 through via holes 27 in the substrate 24. In most embodiments of BGA packages, the IC 21 is encapsulated by a mold compound 28. In optical applications, an opening 29 is formed over the IC 21. Optionally, a light permeable covering, such as glass, is mounted in the opening 29 to protect the die 21. Although BGA packages effectuate large I/O count devices in small areas, they are susceptible to moisture. Generally, moisture seeps into packages while awaiting assembly into a finished product, such as a computer. When the package is quickly heated to solder the device into its end application, moisture trapped within the device turns into vapor and cannot escape quickly enough, causing the package to burst open. This phenomenon is known as the "popcorn" effect. What is needed is a semiconductor package that is robust to both structural stressors and moisture.

SUMMARY OF THE DISCLOSURE

A process for forming a semiconductor package for optical applications comprises at least partially encasing a first leadframe strip in a first mold compound thereby forming a molded leadframe strip, mounting at least one optical semiconductor device on the molded leadframe strip, mounting bondwires on the at least one semiconductor die to effectuate electrical contact between the at least one semiconductor die and the at least one molded leadframe, mounting at least one cap on the molded leadframe strip, at least partially encasing the molded leadframe strip, the at least one semiconductor device, at least one cap, and bondwires and singulating the molded leadframe strip to form discrete packages for optical applications. The cap is configured to allow light to permeate to the optical semiconductor device. The cap comprises at least one of the following materials: glass, silicon, ceramic, metal, epoxy, and plastic. In some embodiments, the process further comprises embossing at least one step cavity into the molded leadframe strip for encapsulating the at least one semiconductor device. Optionally, the process further comprises coupling the first leadframe strip to a second leadframe strip, thereby forming a dual leadframe strip. The first leadframe strip and the second leadframe strip are coupled by a soft metal which comprises at least one of the following materials: gold, silver, lead, and tin. The first and second mold compounds are able to be identical or differing compounds.

An apparatus for forming an semiconductor package for optical applications comprises means for at least partially encasing a first leadframe strip in a first mold compound thereby forming a molded leadframe strip, means for mounting at least one optical semiconductor device on the at least one molded leadframe strip, means for mounting bondwires on the at least one semiconductor die to effectuate electrical contact between the at least one semiconductor die and the molded leadframe, means for mounting a cap thereby forming a full cavity into the molded leadframe strip for encapsulating the at least one semiconductor device, means for at least partially encasing the molded leadframe strip, the at least one semiconductor device, cap, and bondwires in a second mold compound, and means for singulating the molded leadframe strip to form discrete and grid array packages. The cap is configured to allow light to permeate to the optical semiconductor device. The cap comprises at least one of the following materials: glass, silicon, ceramic, metal, epoxy, and plastic. In some embodiments, the apparatus further comprises an embossing surface for forming a step cavity into the molded leadframe strip for encapsulating the at least one semiconductor device. Optionally, the apparatus further comprises means for coupling the first leadframe to a second leadframe by a soft metal. The soft metal comprises at least one of the following materials: gold, silver, lead, and tin. The first and second mold compounds are able to be identical or differing compounds.

A semiconductor package for optical applications comprises a first leadframe, a substrate for supporting the leadframe, at least one semiconductor die mounted on the leadframe, a plurality of bondwires to effectuate electrical contact between the leadframe and the at least one semiconductor die, a cap mounted on the leadframe configured for allowing light to permeate to the at least one semiconductor die and a second mold compound for at least partially encasing the leadframe, the substrate, the at least one semiconductor device and the plurality of wirebonds. In some embodiments, the substrate comprises a first mold compound. Optionally, the first leadframe is coupled to a second leadframe by a soft metal. The soft metal is comprised of at least one of the following materials: gold, silver, lead and tin.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail. For example, it is commonly known in the art of semiconductor device assembly that assembly is generally done on a matrix array of leadframes, often referred to as leadframe strips, each strip having a plurality of individual positions that will be processed in various ways to form individual packaged semiconductor devices. A position can have one or more semiconductor die within. One of ordinary skill in the art will readily ascertain whether a single leadframe or a matrix of leadframes is being referred to depending on the reference.

Figure 3:
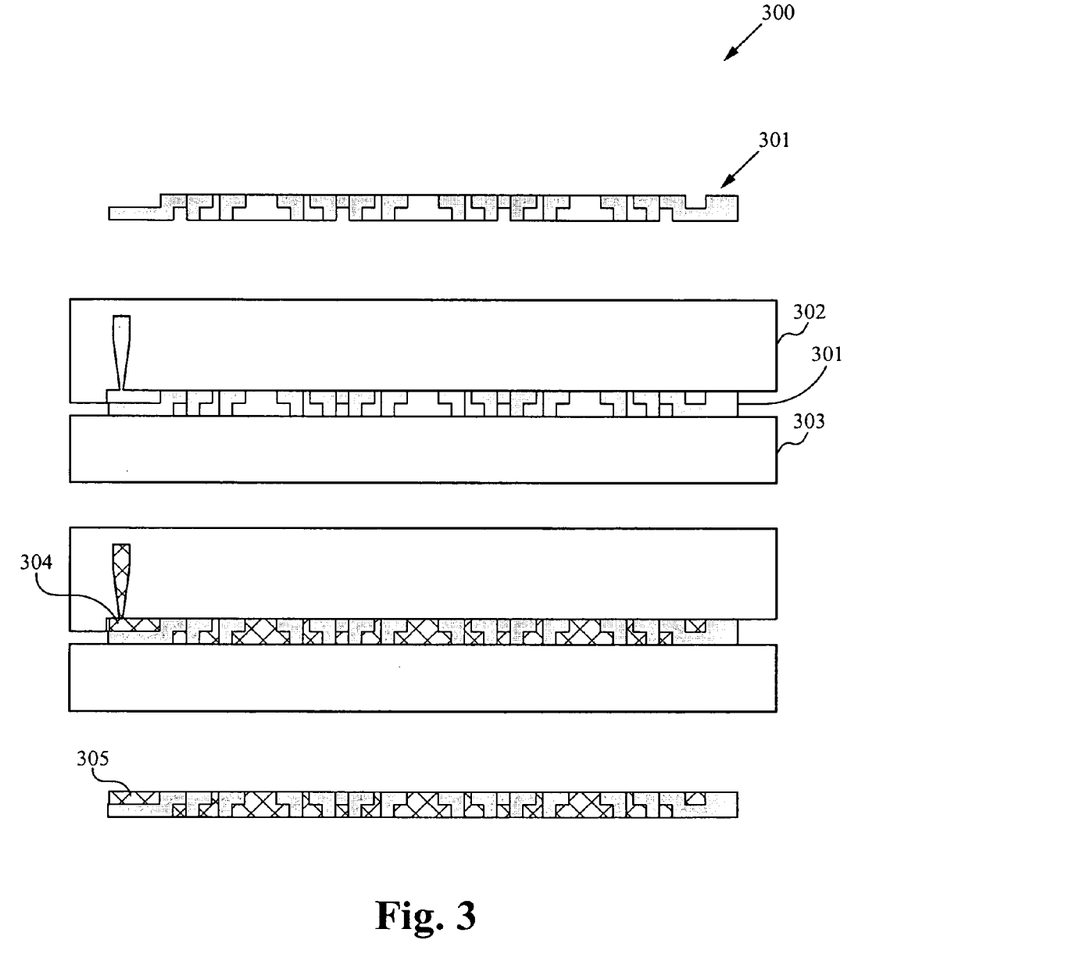
FIG. 3 is a process for forming a molded leadframe per an embodiment of the current invention.

A process 300 for forming semiconductor packages is detailed in FIG. 3. A leadframe strip 301 is shown in cross section. In some embodiments, a top mold 302 and a bottom mold 303 are placed to effectuate the injection therein of a mold compound 304. The top and bottom molds 302, 303 are able to be metal, ceramic, or any material having an appropriate thermal characteristic to withstand the temperatures of the mold compound 304 in its liquid state. It is commonly known by those of ordinary skill in the art of semiconductor device manufacturing that a wide variety of mold compounds 304 can be used, each having advantages, disadvantages, and characteristics appropriate for a given application. By way of example, in high temperature applications such as microprocessors which generate a significant amount of heat, a high thermal conductivity mold compound 304 can be used. What is formed is a molded lead frame 305. Advantageously, the molded leadframe strip 305 will display enhanced rigidity and robust reliability characteristics. The use of a mold compound 304 further enhances encapsulation and protection from external moisture that standard PCB substrates such as polyimide or FR4 cannot provide.

Figure 4A:
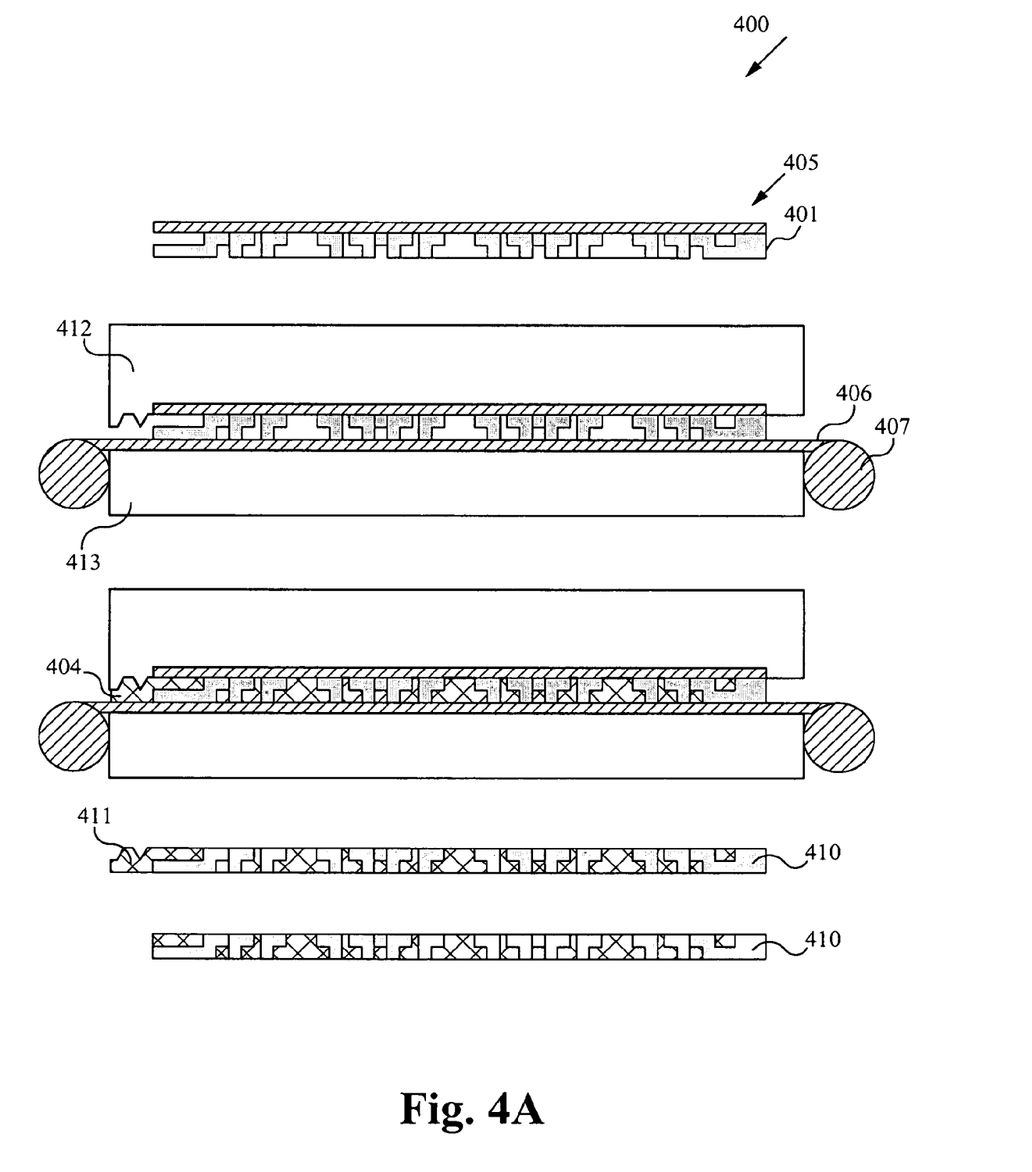
FIG. 4A is a process for forming a molded leadframe per an embodiment of the current invention.

For more predictable molding results, carrier tape is able to be used effectuate the molding process. FIG. 4A details another embodiment of the invention. A process 400 includes applying tape 405 on its adhesive side to a leadframe strip 401. The leadframe strip 401 is then placed in a top mold 412 by the top surface of the leadframe 401. On the opposite side of the leadframe strip 401, non-adhesive tape 406 is prepared in a tape loader 407 at the bottom mold 413. Once the leadframe strip 401 is in place between the top mold 412 and the bottom bold 413, mold compound 404 is injected and fills all empty cavities. When removed from the mold, a molded leadframe strip 410 is formed. Optionally, a de-gate/de-runner step removes excess mold compound 411.

Figure 4B:
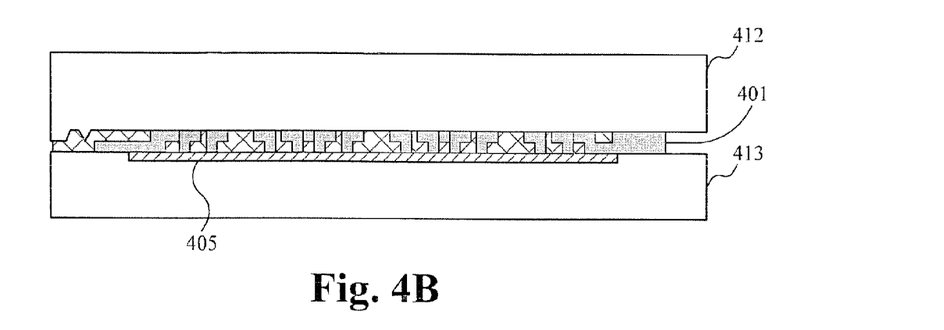
FIG. 4B is a process for forming a molded leadframe per an embodiment of the current invention.
Figure 4C:
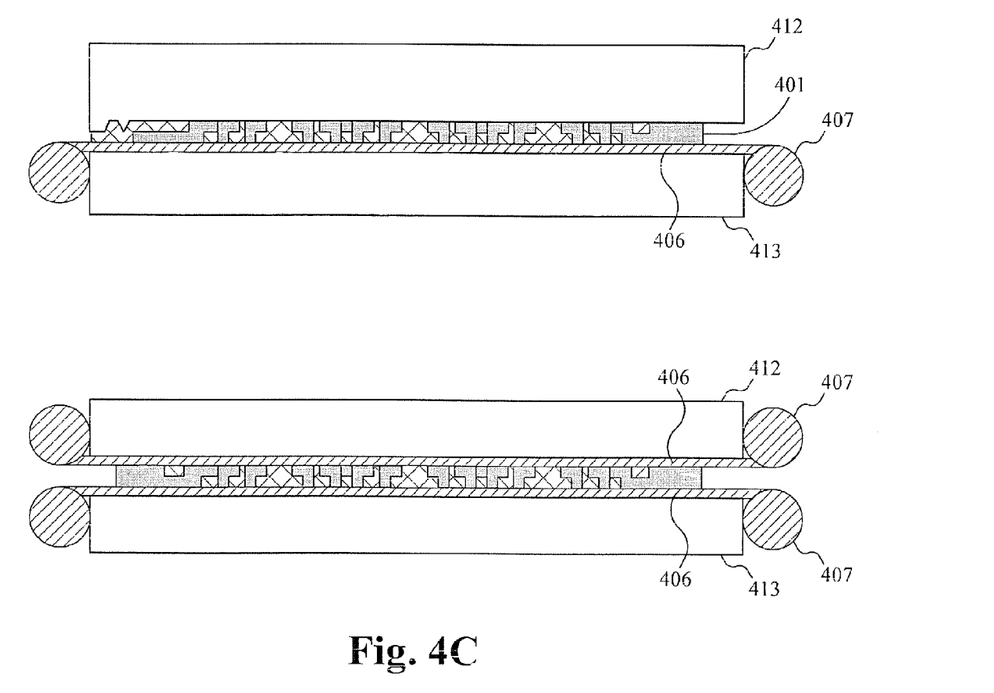
FIG. 4C illustrates two exemplary processes for forming a molded leadframe of the current invention.

FIG. 4B shows alternate embodiments for the process detailed in FIG. 4A. In some embodiments, the leadframe strip 401 is able to be placed between the top mold 412 and bottom mold 413 with adhesive tape 405 applied to the bottom. FIG. 4C shows embodiments wherein the leadframe strip 401 is able to be be placed between the top mold 412 and bottom mold 413 without the use of adhesive tape. In an exemplary embodiment, non adhesive tape 406 is able to be provided by a tape loader 407 on the bottom surface of the leadframe strip 401. In another exemplary embodiment, two tape loaders 407 are provided to effectuate the molding of the leadframe strip 401. It will be appreciated by those of ordinary skill in the art of semiconductor manufacturing that several embodiments exist to place a leadframe strip 401 between a top mold 412 and a bottom mold 413 and the embodiments discussed herein are written solely to be exemplary and non limiting.

Figure 5:
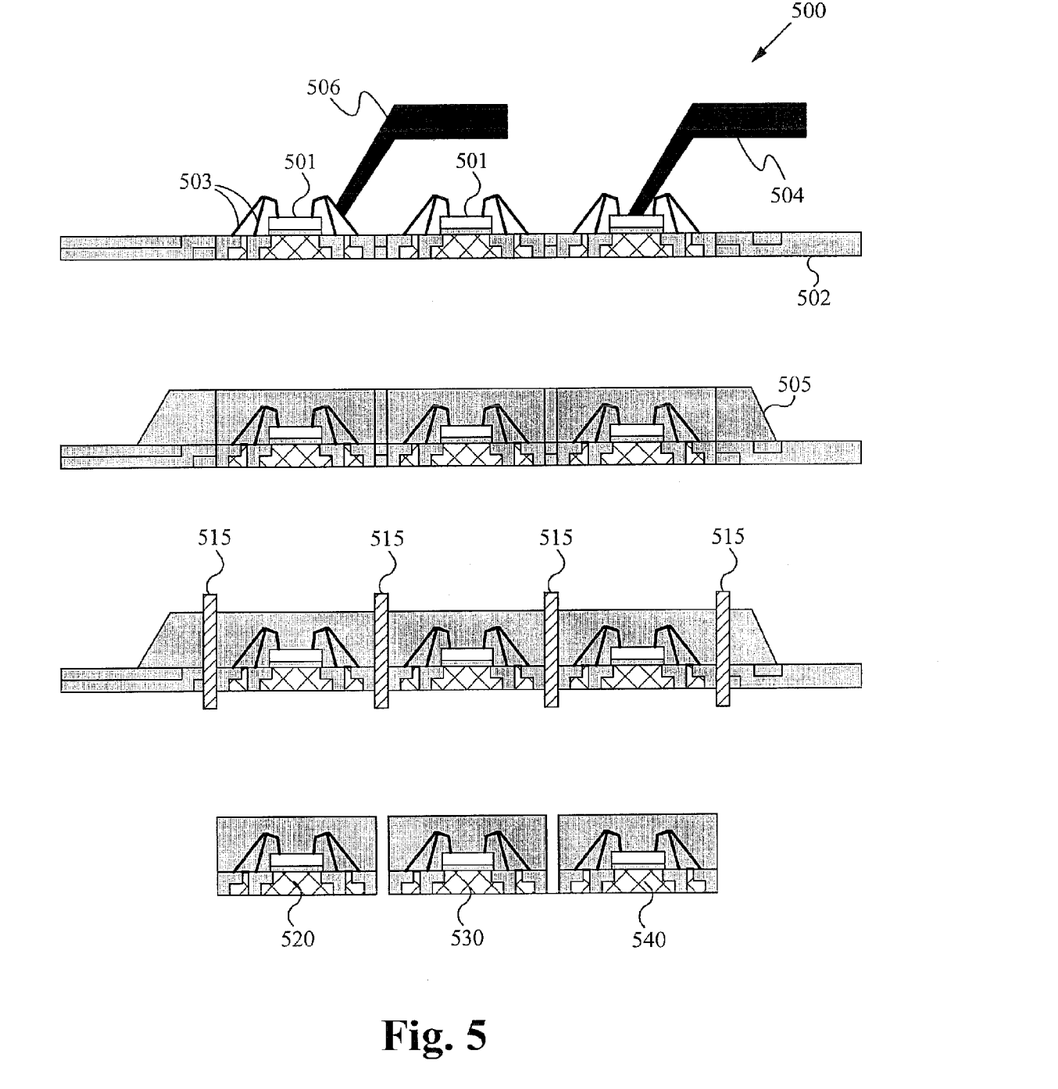
FIG. 5 is a process for forming individual packages per an embodiment of the current invention.

FIG. 5 shows a process 500 for the completion of the semiconductor packaging process. Semiconductor devices 501 are mounted on the molded leadframe strip 502. In some embodiments, multiple semiconductor devices 501 are mounted in each individual position on the molded leadframe strip 502. Such devices are known as multi chip modules (MCM). Bondwires 503 are mounted on the semiconductor devices 501 to effectuate electrical contact between the molded leadframe strip 502 and the semiconductor devices 501. In some embodiments where multiple semiconductor devices 501 are placed in each position, bondwires 503 can be placed to effectuate electrical contact between them as applications require. Next, a second mold compound 505 is applied to the molded leadframe strip 502. The second mold 505 encases the semiconductor devices 501 and bondwires 503 to protect them from harsh outer environments. In some embodiments, the second mold compound 505 and the first mold compound described in FIGS. 3 and 4 are the same. Alternatively, the first and second mold compound 505 are able to be different to meet the demands of particular applications. By way of example, the semiconductor device 501 and the leadframe 401 in FIG. 4 can have different coefficients of expansion in response to heat, and different mold compounds having different thermal characteristics such as thermal resistivity and thermal expansion are able to offset such effects. The molded leadframe strip 502 is then singulated by saw blades 515 to form singulated semiconductor packages 520, 530 and 540. The singulated devices 520 530 and 540 are generally tested, subjected to stress, and tested again to ensure reliability and to filter out non passing or non standard units.

Figure 6A:
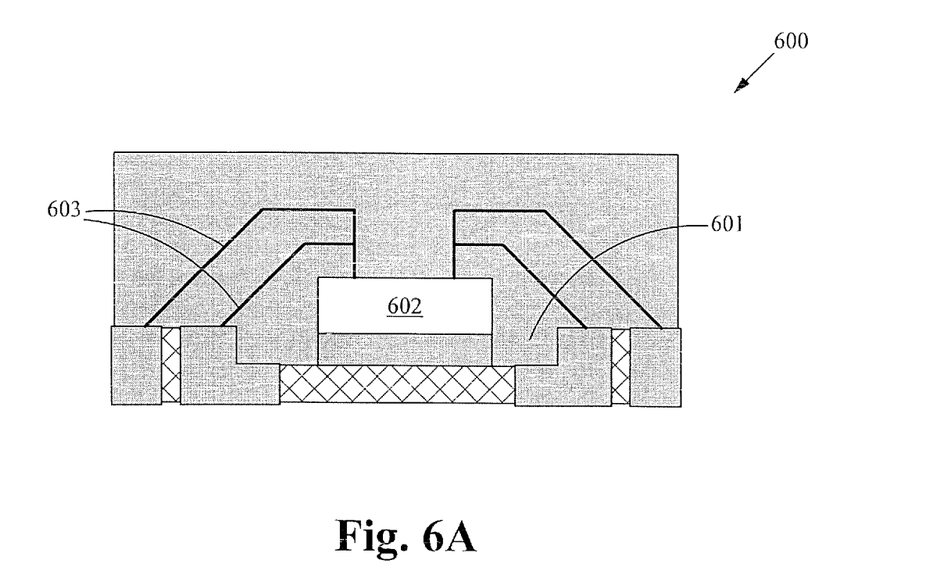
FIG. 6A is a semiconductor package per an embodiment of the current invention.
Figure 6B:
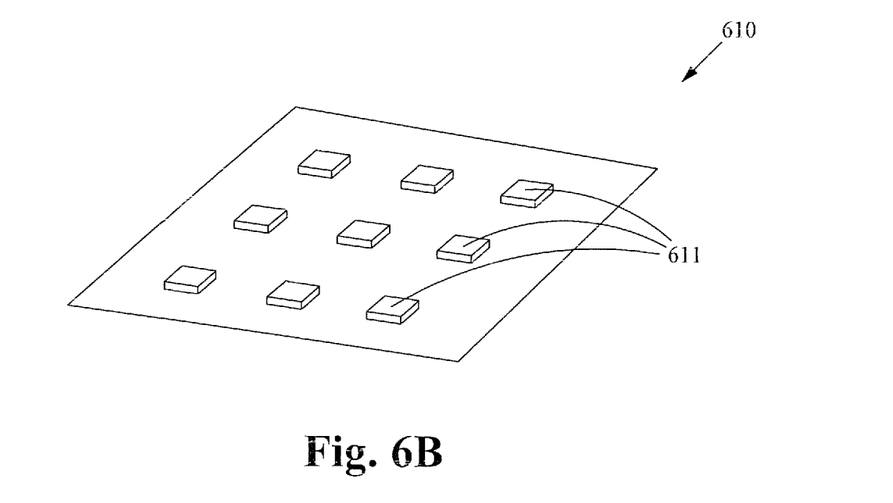
FIG. 6B is apparatus for realizing the package depicted in FIG. 6A.
Figure 6C:
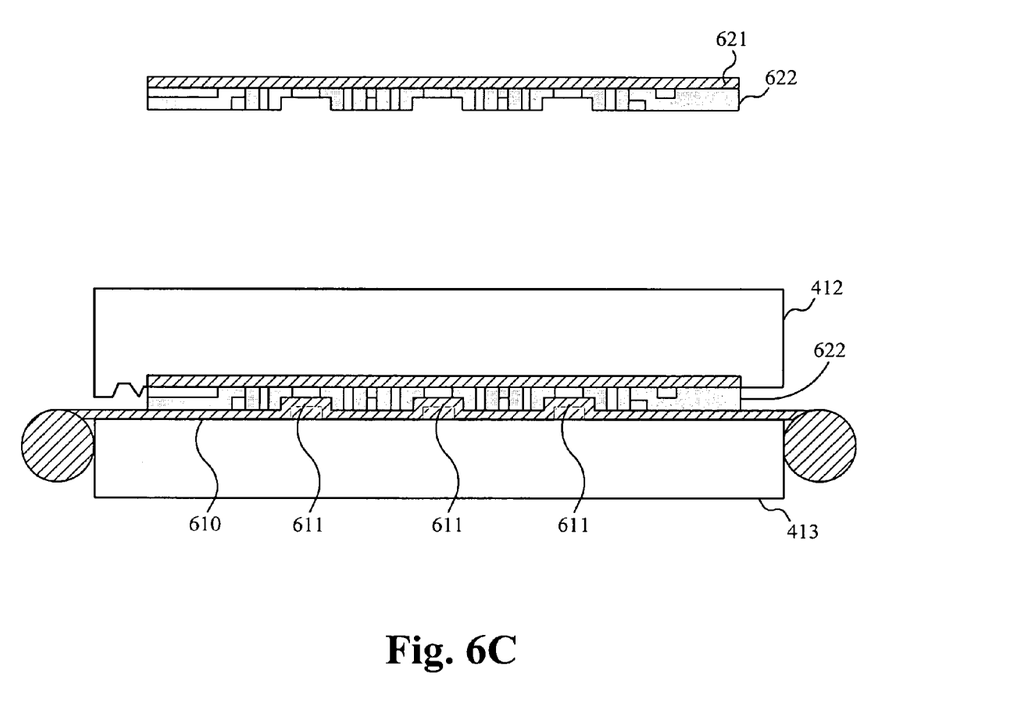
FIG. 6C is an alternate process for forming a package in FIG. 6A.

In some applications, it is advantageous for greater height clearance within the semiconductor package. FIG. 6A shows a singulated semiconductor package 600 in cross section. Within the package, a step cavity 601 is capable of receiving a thicker semiconductor die 602, larger bondwires 603 or in certain embodiments multiple stacked die. FIG. 6B shows an exemplary surface 610 of the mold 412 or 413 shown in FIG. 4B. Elevated protrusions 611 are placed to coincide with a leadframe strip to emboss a recessed area 601 into the leadframe. In an exemplary embodiment, adhesive tape 621 is applied to the back surface of the leadframe strip 622 as shown in FIG. 6C. The leadframe is flipped over such that its top surface is embossed by the surface 610 of the mold 412 or 413 having the protrusions 611.

Figure 6D:
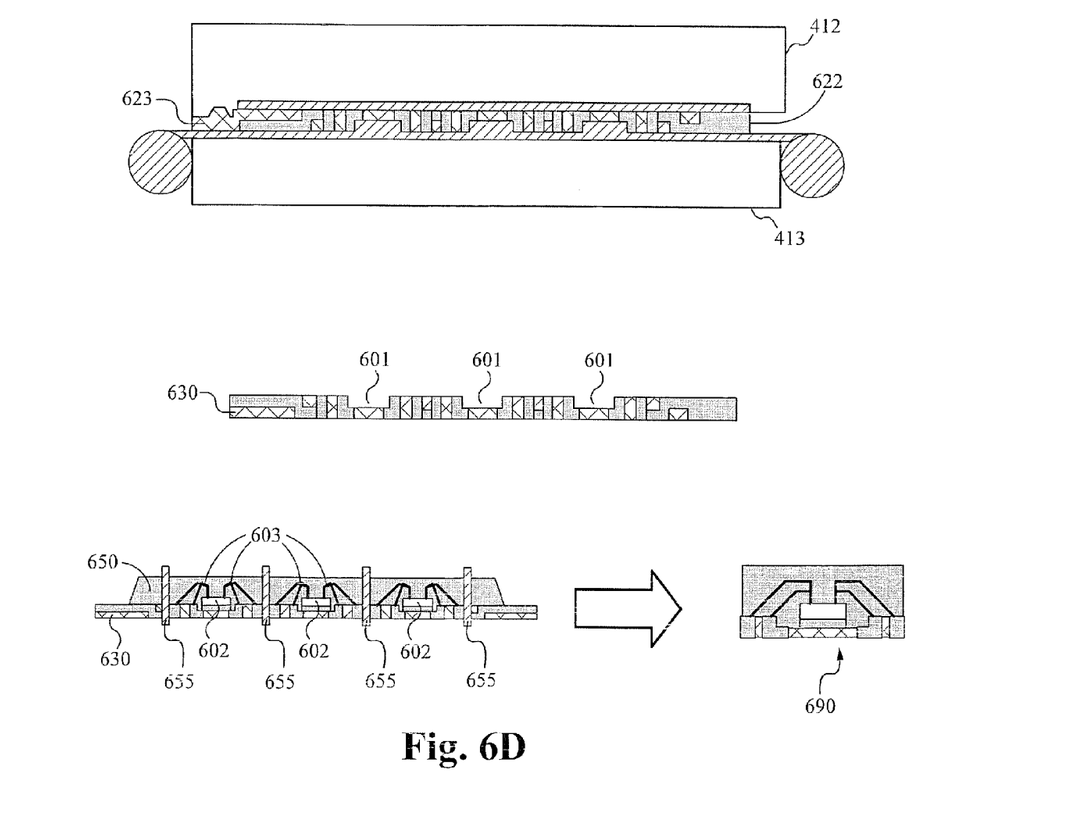
FIG. 6D is the remainder of the process for forming the package FIG. 6A.

FIG. 6D shows the leadframe strip 622 with a first mold compound 623 to form a molded leadframe 630 having recessed areas 601. To form singulated packages, semiconductor devices 602 and bondwires 603 are affixed onto the molded leadframe 630. The devices 602, bondwires 603 and molded leadframe 630 are encased in a second mold compound 650. The second mold compound 650 and the first mold compound 623 are able to be the same compound or different compounds depending on the application. Saw blades 655 then singulate the molded leadframe strip 630 into individual semiconductor packages 690.

Figure 6E:
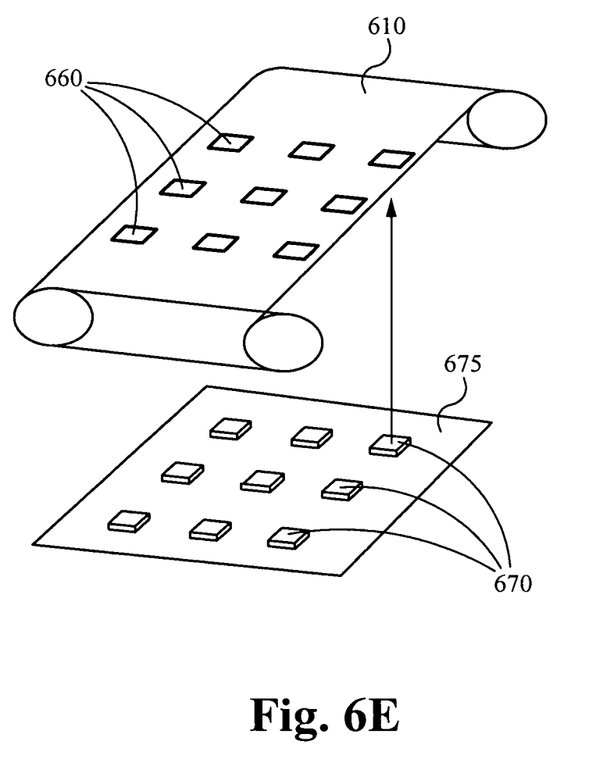
FIG. 6E is an alternate apparatus for realizing the package depicted in FIG. 6A.

As shown in FIG. 6E, in the case of thick leadframes, the non adhesive tape 610 provided by a tape loader is able to have pre-formed holes 660 configured to receive protrusions 670 on a mold surface 675. The mold surface 675 can be the surface of the top mold 412 or the bottom mold 413. The mold is able to be formed of metal, ceramic, hard impact rubber, or any other suitable material.

Figure 7:
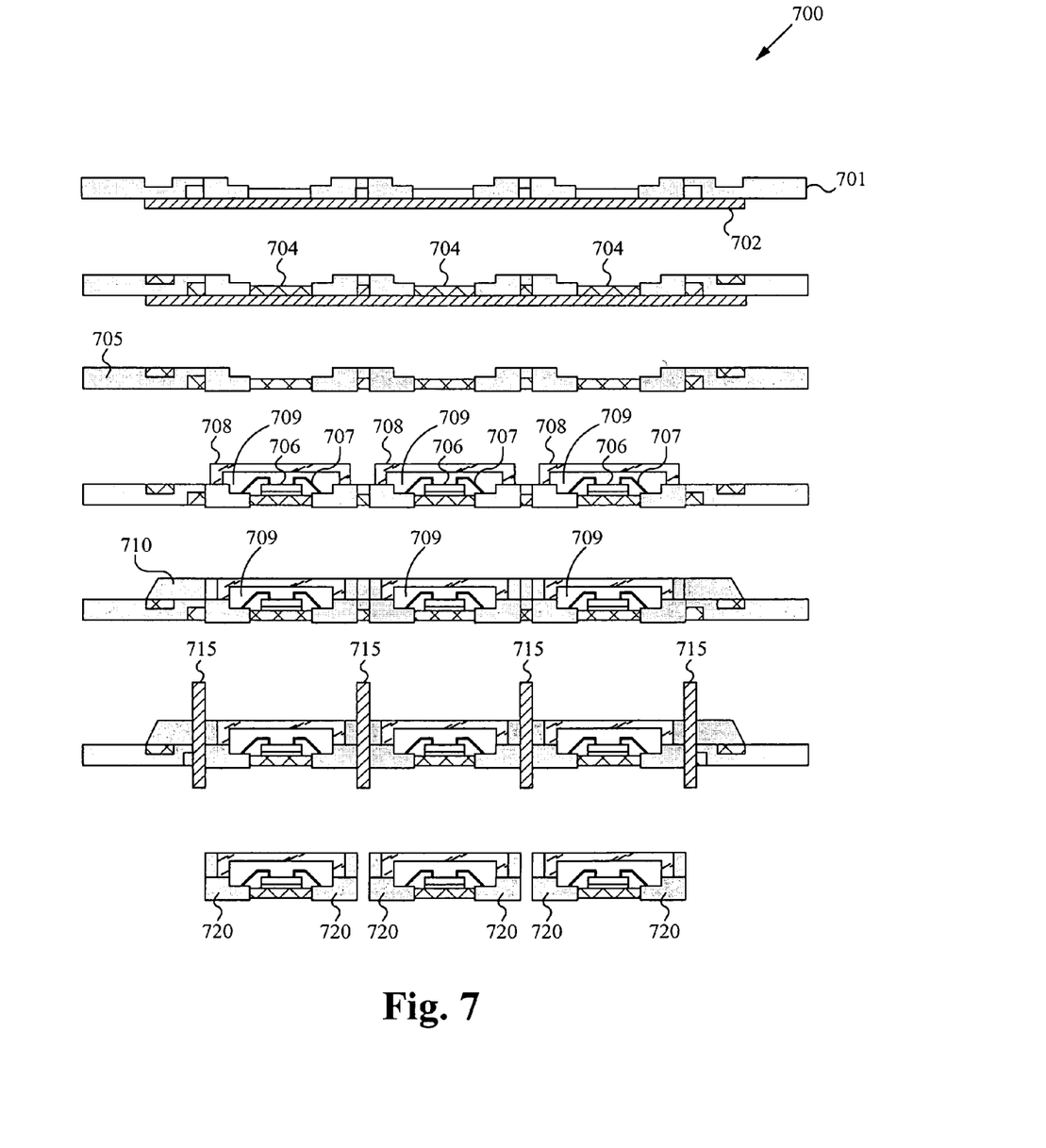
FIG. 7 is a process for forming a semiconductor package having a light penetrable opening for optical applications.
Figure 8:
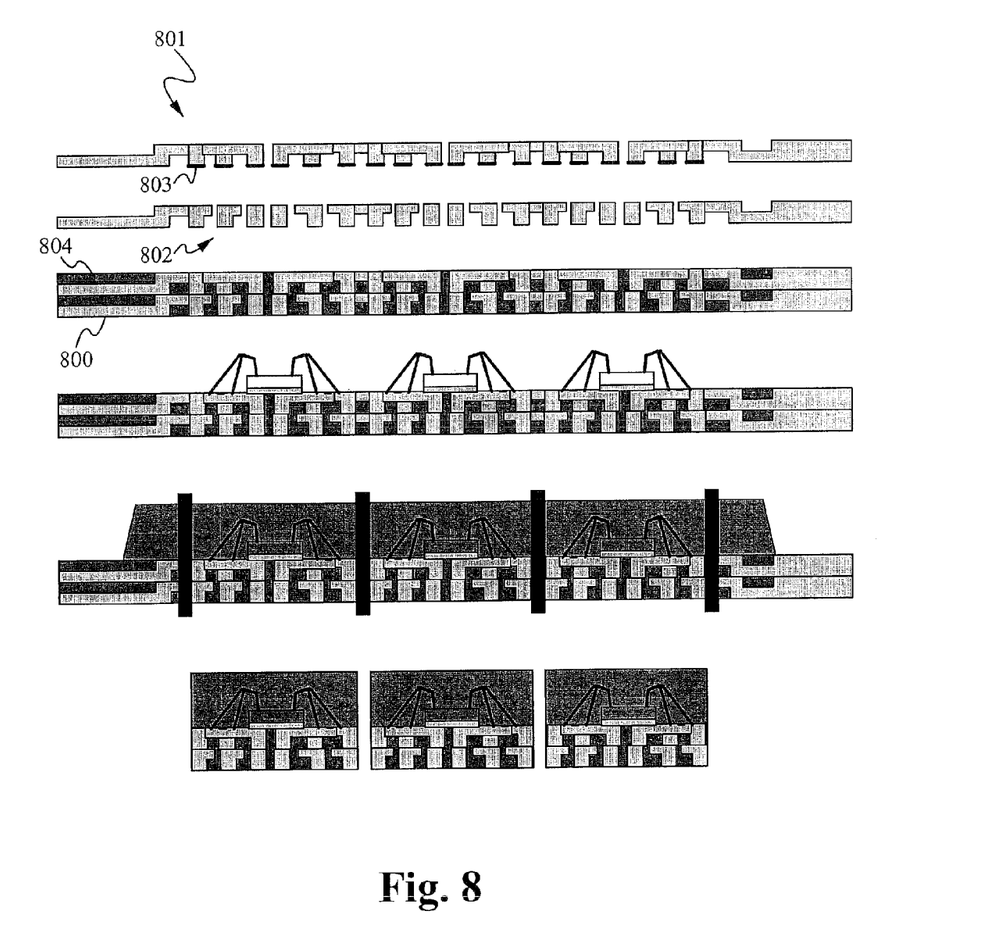

In another aspect of the invention, a semiconductor package having a light permeable exposed surface and a process for producing the same is disclosed in FIG. 7. A leadframe strip 701 is mounted to adhesive tape 702. In some embodiments, the leadframe 701 is a half etched leadframe. The leadframe strip 701 is molded with a first mold compound 703. By way of example, the first mold compound is able to be a thermoset compound or a thermoplastic compound. In some embodiments, step cavities 704 are formed by the embossing procedure described in FIGS. 6A-6E. The adhesive tape 702 is removed forming a molded step cavity leadframe strip 705. At least one semiconductor device 706 is mounted within each cavity 704. Wirebonds 707 effectuate electrical contact between the semiconductor device and molded step cavity leadframe strip 705. In some embodiments where multiple semiconductor devices 706 are mounted in each step cavity 704, wirebonds 707 are able to effectuate electrical contact between the multiple devices 706 as applications require. A cap 708 is affixed to the molded cavity leadframe strip forming a full cavity 709. The cap 708 is able to be comprised of silicon, glass, metal, ceramic, or any other convenient material or combination of materials that are light permeable. A second mold compound 710 is formed over the molded step cavity leadframe strip 705, semiconductor devices 706 and wirebonds 707. Preferably, the second mold compound is applied to allow light to permeate the cap 708. The second mold compound 710 is able to be identical to or different from the first mold compound 703 as applications require. Saw blades 715 singulate the molded step cavity leadframe strip 705 into individual optical packaged devices 720. The devices 720 are then able to be marked, tested and shipped to customers. In some applications, multiple hundreds of I/O are required, and more than one leadframe is required to effectuate contact between a semiconductor device and its application. Furthermore, flexibility in routing I/O is advantageous, since end users can have specific demands as to the locations of I/O on a package landing pattern. To that end, a second leadframe (not shown) is able to be used. A second leadframe is able to couple to the first leadframe by use of a soft metal. The second leadframe is able to be used to route the I/O to any pattern required by an application, allowing great flexibility in footprints and landing patterns.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A process of forming a semiconductor package for optical applications, the process comprising:
    placing a first leadframe strip in a mold cavity that is defined by a top mold and a bottom mold, wherein the bottom mold includes a tape loader to provide tape that has pre-formed holes configured to receive protrusions on a surface of the bottom mold;
    at least partially encasing the first leadframe strip in a first mold compound thereby forming a molded leadframe strip, wherein the molded leadframe strip includes a first planar surface and a second planar surface that is lower than the first planar surface;
    mounting at least one optical semiconductor device on the molded leadframe strip between a first portion of the second planar surface and a second portion of the second planar surface;
    mounting bondwires on the at least one optical semiconductor device to effectuate electrical contact between the at least one optical semiconductor device and the second planar surface;
    mounting at least one cap on the molded leadframe strip, wherein each of the at least one cap includes a lateral surface forming an opening at an underside of the at least one cap, wherein the lateral surface is perpendicular and affixed to the first planar surface;

at least partially encasing the molded leadframe strip and the at least one cap in a second mold compound such that the second mold compound is on the first planar surface and abuts an exterior portion of the lateral surface; and singulating the molded leadframe strip to form discrete packages for optical applications.

2. The process in claim 1, further comprising embossing at least one step cavity into the molded leadframe strip for receiving the at least one optical semiconductor device.

3. The process in claim 1, wherein the cap is configured to allow light to permeate to the at least one optical semiconductor device.

4. The process in claim 1, wherein the cap comprises at least one of the following materials: glass, silicon, ceramic, metal, epoxy, and plastic.

5. The process in claim 1, further comprising coupling the first leadframe strip to a second leadframe strip, thereby forming a dual leadframe strip.

6. The process in claim 5, wherein the first leadframe strip and the second leadframe strip are coupled by a soft metal which comprises at least one of the following materials: gold, silver, lead, and tin.

7. The process in claim 1, wherein the first and second mold compounds comprise the same material.

8. The process of claim 1, wherein the first and second mold compounds comprise differing material.

9. A process of forming a semiconductor package for optical applications, the process comprising:

providing a first leadframe strip including a front surface and a back surface;

placing the first leadframe strip in a mold cavity that is defined by a top mold and a bottom mold, wherein the bottom mold coupled with nonadhesive tape that includes pre-formed holes configured to receive protrusions on a surface of the bottom mold;

at least partially encasing the first leadframe strip in a first mold compound thereby forming a molded leadframe strip, wherein the first leadframe strip includes at least one step cavity, a first planar surface and a second planar surface, wherein the first mold compound is in the at least one step cavity;

mounting at least one optical semiconductor device on the first mold compound that is in the at least one step cavity;

mounting bondwires on the at least one optical semiconductor device to effectuate electrical contact between the at least one optical semiconductor device and the second planar surface;

mounting at least one cap on the molded leadframe strip, wherein each of the at least one cap includes a well on an underside of the at least one cap, wherein a wall defining the well is perpendicular and affixed to the first planar surface;

at least partially encasing the molded leadframe strip and the at least one cap in a second mold compound such that the second mold compound is on the first planar surface and adjacent to the wall; and singulating the molded leadframe strip to form discrete packages for optical applications.

10. The process of claim 9, wherein at least partially encasing a first leadframe strip in a first mold compound comprises: injecting the first mold compound into the mold cavity.

11. The process of claim 9, wherein placing the first leadframe strip in a mold cavity comprises applying adhesive tape to the back surface of the first leadframe.

12. The process of claim 9, wherein each of the at least one step cavity corresponds to one of the protrusions.

13. The process of claim 9, wherein a full cavity is defined at least by the well, the first mold compound and the second planar surface.

14. The process of claim 9, wherein the perimeter at a top of the at least one cap is the same size as the perimeter at a bottom of the cap.

15. The process of claim 9, wherein the at least one cap is configured for allowing light to permeate via an exposed top of the cap to the at least one optical semiconductor device, wherein the wall is perpendicular to the exposed top.

16. The process of claim 9, wherein the second mold compound and the wall affixed to the first planar surface cover the entirety first planar surface.

* * * * *